(12) United States Patent
Kemerer et al.

(10) Patent No.: US 7,694,262 B2
(45) Date of Patent: *Apr. 6, 2010

(54) DEEP TRENCH CAPACITOR AND METHOD OF MAKING SAME

(75) Inventors: Timothy Wayne Kemerer, Essex Junction, VT (US); Robert Mark Rassel, Colchester, VT (US); Steven M. Shank, Jericho, VT (US); Francis Roger White, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 212 days.

This patent is subject to a terminal disclaimer.

(21) Appl. No.: 11/872,787

(22) Filed: Oct. 16, 2007

(65) Prior Publication Data

US 2009/0100388 A1 Apr. 16, 2009

Related U.S. Application Data

(63) Continuation-in-part of application No. 11/767,616, filed on Jun. 25, 2007.

(51) Int. Cl.
 *G06F 17/50* (2006.01)
(52) U.S. Cl. ............................................. 716/12; 716/1
(58) Field of Classification Search ............. 716/10–14
 See application file for complete search history.

(56) References Cited

U.S. PATENT DOCUMENTS 6,448,610 B2 * 9/2002 Weis ........................... 257/330
7,067,372 B2 * 6/2006 Schrems et al. ............. 438/245

* cited by examiner

*Primary Examiner*—Jack Chiang
*Assistant Examiner*—Binh C Tat
(74) *Attorney, Agent, or Firm*—Schmeiser, Olsen & Watts; Anthony J. Canale

(57) ABSTRACT

A trench capacitor, method of forming a trench capacitor and a design structure for a trench capacitor. The trench capacitor including: a trench in a single-crystal silicon substrate, a conformal dielectric liner on the sidewalls and the bottom of the trench; an electrically conductive polysilicon inner plate filling regions of the trench not filled by the liner; an electrically conductive doped outer plate in the substrate surrounding the sidewalls and the bottom of the trench; a doped silicon region in the substrate; a first electrically conductive metal silicide layer on a surface region of the doped silicon region exposed at the top surface of the substrate; a second electrically conductive metal silicide layer on a surface region of the inner plate exposed at the top surface of the substrate; and an insulating ring on the top surface of the substrate between the first and second metal silicide layers.

11 Claims, 3 Drawing Sheets

DEEP TRENCH CAPACITOR AND METHOD OF MAKING SAME

This application is a continuation-in-part of U.S. patent application Ser. No. 11/767,616 filed on Jun. 25, 2007.

FIELD OF THE INVENTION

The present invention relates to the field of integrated circuits; more specifically, it relates to deep trench capacitors for use in integrated circuits, a method of fabricating the deep trench capacitors and a design structures for the deep trench capacitors.

BACKGROUND OF THE INVENTION

The trend in integrated circuit technology is to increased circuit density and faster circuits. Current deep trench capacitor technology places limitations on the minimum pitch and minimum deep trench capacitor surface area based on the methods used contact the deep trench capacitors and the need to isolate the deep trench capacitor from other structures using trench isolation schemes. These restrictions increase the amount of space to be set aside for capacitors as well as increasing the series resistance to the outer plate of the capacitor. Therefore, there is a need for deep trench capacitors and methods of fabricating deep trench capacitors that are more compatible with the need for increased circuit density and faster circuits.

SUMMARY OF THE INVENTION

A first aspect of the present invention is a structure, comprising: a trench in a single-crystal silicon substrate, the trench extending from a top surface of the substrate into the substrate in a direction perpendicular to a top surface of the substrate, the trench having sidewalls and a bottom; a conformal dielectric liner on the sidewalls and the bottom of the trench, a top edge of the liner exposed at the top surface of the substrate; an electrically conductive polysilicon inner plate filling regions of the trench not filled by the liner; an electrically conductive doped outer plate in the substrate surrounding the sidewalls and the bottom of the trench and in direct physical contact with the dielectric liner, the outer plate extending from the top surface of the substrate to under the trench; a doped silicon region in the substrate, the doped silicon region extending from the top surface of the substrate into the substrate the direction perpendicular to the top surface of the substrate, the doped region physically and electrically contacting the outer plate; a first electrically conductive metal silicide layer on a surface region of the doped silicon region exposed at the top surface of the substrate; a second electrically conductive metal silicide layer on a surface region of the inner plate exposed at the top surface of the substrate; and an insulating ring on the top surface of the substrate between the first and second metal silicide layers.

A second aspect of the present invention is a method comprising: forming a trench in a single-crystal silicon substrate, the trench extending from a top surface of the substrate into the substrate in a direction perpendicular to a top surface of the substrate, the trench having sidewalls and a bottom; forming a conformal dielectric liner on the sidewalls and the bottom of the trench, a top edge of the liner exposed at the top surface of the substrate; filling regions of the trench not filled by the liner with an electrically conductive polysilicon inner plate; forming an electrically conductive doped outer plate in the substrate surrounding the sidewalls and the bottom of the trench and in direct physical contact with the dielectric liner, the outer plate extending from the top surface of the substrate to under the trench; forming a doped silicon region in the substrate, the doped silicon region extending from the top surface of the substrate into the substrate the direction perpendicular to the top surface of the substrate, the doped region physically and electrically contacting the outer plate; forming a first electrically conductive metal silicide layer on a surface region of the doped silicon region exposed at the top surface of the substrate; forming a second electrically conductive metal silicide layer on a surface region of the inner plate exposed at the top surface of the substrate; and forming an insulating ring on the top surface of the substrate between the first and second metal silicide layers.

A fourth aspect of the present invention is a design structure embodied in a machine readable medium used in a design process, the design structure comprising: a trench in a single-crystal silicon substrate, the trench extending from a top surface of the substrate into the substrate in a direction perpendicular to a top surface of the substrate, the trench having sidewalls and a bottom; a conformal dielectric liner on the sidewalls and the bottom of the trench, a top edge of the liner exposed at the top surface of the substrate; an electrically conductive polysilicon inner plate filling regions of the trench not filled by the liner; an electrically conductive doped outer plate in the substrate surrounding the sidewalls and the bottom of the trench and in direct physical contact with the dielectric liner, the outer plate extending from the top surface of the substrate to under the trench; a doped silicon region in the substrate, the doped silicon region extending from the top surface of the substrate into the substrate the direction perpendicular to the top surface of the substrate, the doped region physically and electrically contacting the outer plate; a first electrically conductive metal silicide layer on a surface region of the doped silicon region exposed at the top surface of the substrate; a second electrically conductive metal silicide layer on a surface region of the inner plate exposed at the top surface of the substrate; and an insulating ring on the top surface of the substrate between the first and second metal silicide layers.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
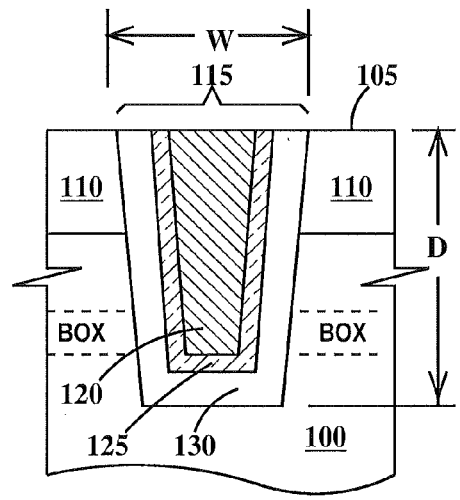
FIGS. 1A through 1D are cross-sectional drawings illustrating fabrication of a trench capacitor according to embodiments the present invention.

FIGS. 1A through 1D are cross-sectional drawings illustrating fabrication of a trench capacitor according to embodiments the present invention. In FIG. 1A, formed in a single-crystal silicon substrate 100, adjacent to a top surface 105 of the substrate is a doped region 110. Substrate 100 may be a silicon-on insulator (SOI) substrate. Also formed in substrate 100 is a deep trench capacitor 115. Deep trench capacitor 115 comprises an electrically conductive polysilicon core 120 (or inner plate 120), which may be doped or undoped, a dielectric layer (e.g. a silicon dioxide layer ($SiO_2$)), and a diffused doped region 130 (or outer plate 130). Outer plate 120 surrounds the sidewalls and bottom of dielectric layer 125 and dielectric layer 125 surrounds the sidewall and bottom of inner plate 120. Deep trench capacitor has a width W and extends from top surface 105 of substrate 100 a depth D into the substrate. In one example D is between about 0.5 microns to about 10 microns deep. In one example the ratio D/W is greater than or equal to about 2. When substrate 100 is a SOI substrate, deep trench capacitor may extend through a buried oxide (BOX) layer of the substrate as shown by the dashed line in FIG. 1A or terminate on the BOX layer. In a first example, inner plate 120 is doped P-type and outer plate 130 is doped N type. In a second example, inner plate 120 is doped N-type and outer plate 130 is doped P type. In a third example, inner plate 120 and outer plate 130 are both doped N-type. In a fourth example, inner plate 120 and outer plate 130 are both doped P-type. Region 110 is always doped the same type as outer plate 130. Substrate 100 may be undoped, doped N type or doped P type.

In one example, the trench capacitor 100 may be formed by: (1) etching a trench into substrate 100, (2) filling the trench with a doped oxide and heating the substrate to drive dopant out of the oxide fill into the regions of the substrate immediately surrounding the trench to form the outer plate, (3) removing the oxide fill and depositing a conformal dielectric material on the sidewalls or bottom of the trench or thermally oxidizing the sidewalls and bottom of the trench and (4) filling the trench with polysilicon, which may include overfilling the trench with polysilicon followed by a planarizing chemical-mechanical-polish (CMP).

Figure 1B:
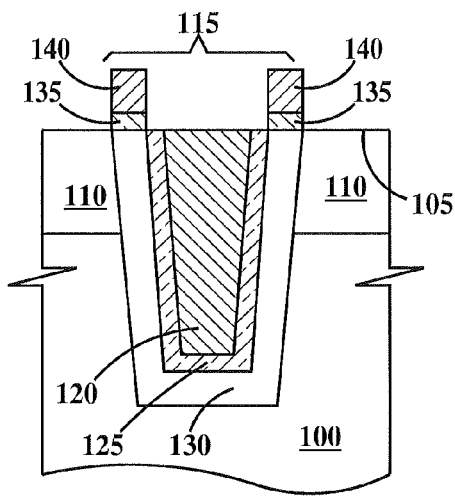

In FIG. 1B, a gate dielectric layer has been formed on top surface 105 of substrate 100, a gate polysilicon layer has been formed on top of the gate dielectric layer and then the gate polysilicon layer and the gate dielectric layer photolithographically masked and etched to leave rings of gate dielectric 135 and gate polysilicon 140 adjacent to the periphery of trench capacitor 115.

Figure 1C:
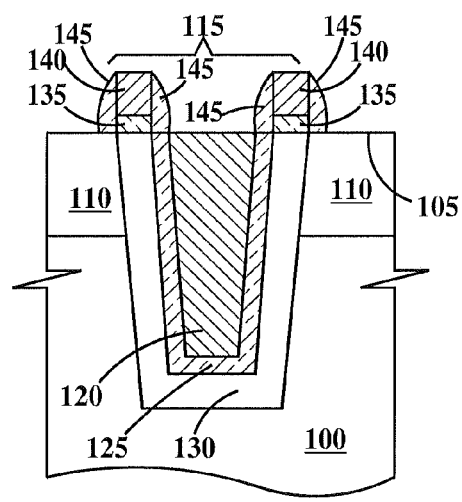

In FIG. 1C, dielectric spacers 145 have been formed on the sidewalls of the rings of gate dielectric 135 and gate polysilicon 140. Spacers 145 may be formed by depositing a thin conformal layer of dielectric (e.g. $SiO_2$ or silicon nitride ($Si_3N_4$)) followed by a directional reactive ion etch (RIE). The alignment of the composite ring formed of gate dielectric 135, gate polysilicon 140 and sidewall spacers 145 relative to inner plate 120 and outer plate 130 is illustrated in FIGS. 2A through 2C.

Figure 1D:
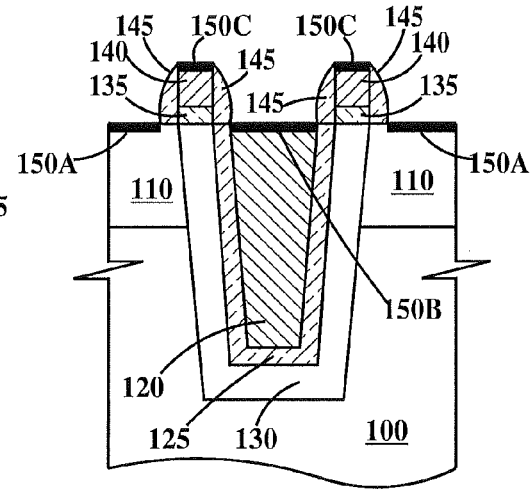

In FIG. 1D, an electrically conductive metal silicide layer 150A has been formed on doped region 110, an electrically conductive metal silicide layer 150B has been formed on inner plate 120 and an electrically conductive metal silicide layer 150C has been formed on gate polysilicon 145. Silicide layers 150A, 150B and 150C may be formed simultaneously by: (1) blanket depositing or sputtering of a thin conformal metal layer, (2) heating the substrate and metal layer to a high enough temperature in a non-oxidizing or reducing atmosphere to cause the metal to react with silicon (but not with silicon oxide or silicon nitride) to form a metal silicide and (3) removing any unreacted metal (e.g. by wet etching).

Figure 2A:
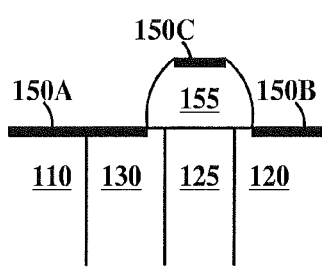
FIGS. 2A through 2C are schematic diagrams illustrated alternative alignments of the structure illustrated in FIG. 1D.
Figure 2B:
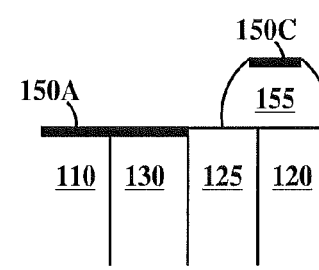
Figure 2C:
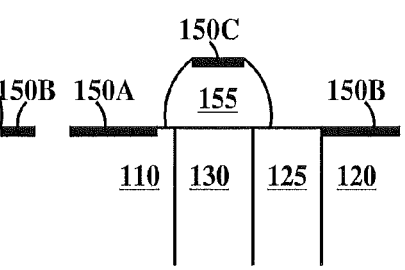

FIGS. 2A through 2C are schematic diagrams illustrated alternative alignments of the structure illustrated in FIG. 1D.

In FIGS. 2A, 2B and 2C, an insulating ring 155 represents the ring comprised of gate dielectric 135, gate polysilicon 140 and spacers 145 of FIG. 1D. It should be understood that dielectric layer 125 is usually so thin as to allow bridging of silicide to short silicide layer 150A and 150B if ring 155 were not present, as ring 155 increases the distance along the surface of the substrate between the two silicide layers. In the examples of FIGS. 2A, 2B and 2C, at least one edge when viewed from above (either an inner edge or an outer edge) of dielectric layer 125 is aligned under ring 155. This is not always necessary as long as ring 155 is formed on top surface 105 of substrate 100 (see FIGS. 1C and 1D) between silicide layer 150A and silicide layer 150B.

Figure 3:
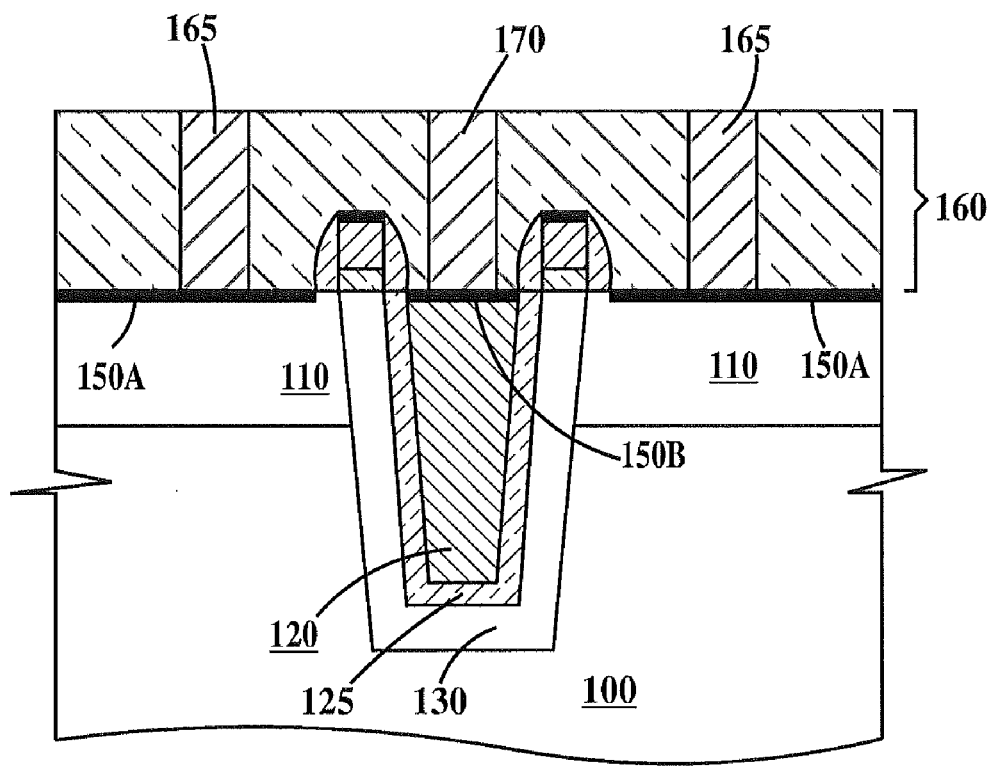
FIG. 3 illustrates further fabrication steps of the trench capacitors according to embodiments of the present invention.

FIG. 3 illustrates further fabrication steps of the trench capacitors according to embodiments of the present invention. In FIG. 3, a blanket dielectric layer 160 is formed over substrate 160 and metal contacts 165 and 170 formed in the dielectric layer. Contacts 165 extend from a top surface of dielectric layer 160 to silicide layer 150 on doped region 110. Contact 170 extends from the top surface of dielectric layer 170 to silicide layer 150 on inner plate 120. In one example, contacts 165 and 170 are comprised of tungsten (W), titanium (Ti), titanium nitride (TiN), tantalum (Ta), tantalum nitride (TaN), copper, (CU) or combinations thereof. Doping levels of doped region 110 and outer plate 130 are high enough so as to form a low resistance interface. Metal silicides generally provide very low resistance interfaces between metal contacts and silicon. Thus, a first low resistance electrically conductive path extends from contacts 165 through metal silicide layers 150A to doped region 110 to outer plate 130 and a second low resistance path exists from contacts 170 through silicide layer 150B to inner plate 120.

Figure 4:
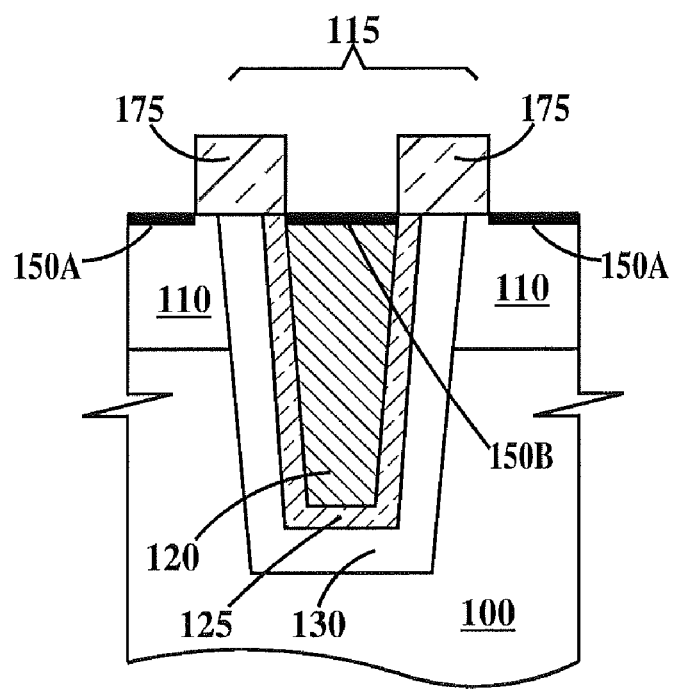
FIG. 4 is a cross-sectional drawing illustrating an alternative method and structure for trench capacitors according to embodiments of the present invention.

FIG. 4 is a cross-sectional drawing illustrating an alternative method and structure for trench capacitors according to embodiments of the present invention. In FIG. 4, instead of a ring comprised of gate dielectric 135, gate polysilicon 140 and sidewall spacers 145 (see FIG. 1D) or ring 155 (see FIGS. 2A, 2B and 2C), a dielectric ring 175 is substituted. Dielectric ring 175 prevents metal silicide layer 150 bridging to metal silicide layer just as ring 155 of FIGS. 2A, 2B and 2C did. In one example, dielectric ring 175 may comprise $SiO_2$ or $Si_3N_4$.

Figure 5:
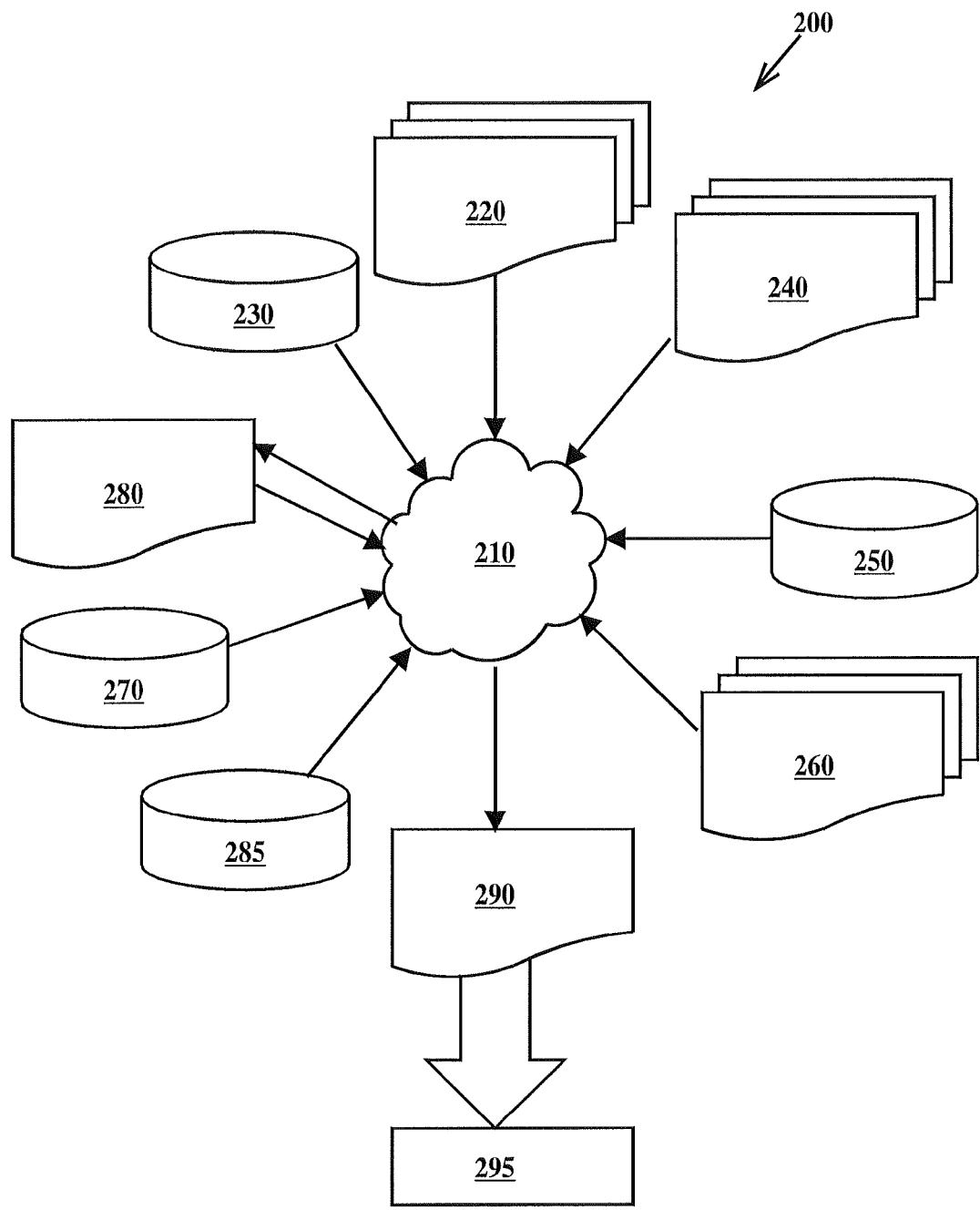
FIG. 5 is a flow diagram of a design process used in semiconductor design, manufacturing, and/or test.

FIG. 5 is a flow diagram of a design process used in semiconductor design, manufacturing, and/or test. In FIG. 5, a design flow 200 may vary depending on the type of IC being designed. For example, a design flow 200 for building an application specific IC (ASIC) may differ from a design flow 200 for designing a standard component. Design structure 220 is preferably an input to a design process 210 and may come from an IP provider, a core developer, or other design company or may be generated by the operator of the design flow, or from other sources. Design structure 220 comprises the deep trench capacitor illustrated in FIGS. 2A, 2B. 2C, 3 and 4 in the form of schematics or HDL, a hardware-description language (e.g., Verilog, VHDL, C, etc.). Design structure 220 may be contained on one or more machine readable medium. For example, design structure 220 may be a text file or a graphical representation of the deep trench capacitor illustrated in FIGS. 2A, 2B. 2C, 3 and 4. Design process 210 preferably synthesizes (or translates) the deep trench capacitor illustrated in FIGS. 2A, 2B. 2C, 3 and 4 into a netlist 280, where netlist 280 is, for example, a list of wires, transistors, logic gates, control circuits, I/O, models, etc. that describes the connections to other elements and circuits in an integrated circuit design and recorded on at least one of machine readable medium. This may be an iterative process in which netlist 280 is re-synthesized one or more times depending on design specifications and parameters for the circuit.

Design process 210 may include using a variety of inputs; for example, inputs from library elements 230 which may house a set of commonly used elements, circuits, and devices, including models, layouts, and symbolic representations, for a given manufacturing technology (e.g., different technology nodes, 32 nm, 45 nm, 20 nm, etc.), design specifications 240, characterization data 250, verification data 260, design rules 270, and test data files 285 (which may include test patterns and other testing information). Design process 210 may further include, for example, standard circuit design processes such as timing analysis, verification, design rule checking, place and route operations, etc. One of ordinary skill in the art of integrated circuit design can appreciate the extent of possible electronic design automation tools and applications used in design process 210 without deviating from the scope and spirit of the invention. The design structure of the invention is not limited to any specific design flow.

Ultimately, design process 210 preferably translates the deep trench capacitor illustrated in FIGS. 2A, 2B. 2C, 3 and 4, along with the rest of the integrated circuit design (if applicable), into a final design structure 220 (e.g., information stored in a GDS storage medium). Final design structure 220 may comprise information such as, for example, test data files, design content files, manufacturing data, layout parameters, wires, levels of metal, vias, shapes, test data, data for routing through the manufacturing line, and any other data required by a semiconductor manufacturer to produce the deep trench capacitor illustrated in FIGS. 2A, 2B. 2C, 3 and 4. Final design structure 220 may then proceed to a stage 225 where, for example, final design structure 220: proceeds to tape-out, is released to manufacturing, is sent to another design house or is sent back to the customer.

Thus, the present invention provides for deep trench capacitors, methods of fabricating deep trench capacitors and design structures for deep trench capacitors that are more compatible with the need for increased circuit density and faster circuits.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A design structure embodied in a machine readable medium used in a design process, the design structure comprising:
   a trench in a semiconductor substrate, said trench extending from a top surface of said substrate into said substrate in a direction perpendicular to a top surface of said substrate, said trench having sidewalls and a bottom;
   a conformal liner having an inner surface and opposite outer surface, said inner surface of a conformal dielectric liner in direct physical contact with said sidewalls and said bottom of said trench, a top edge of said liner exposed at said top surface of said substrate;
   an electrically conductive polysilicon inner plate filling regions of said trench not filled by said liner, said polysilicon inner plate in direct physical contact with the entire outer surface of said liner in said trench, said polysilicon inner plate extending to said top surface of said substrate;
   an electrically conductive doped outer plate in the form of a layer in said substrate surrounding said sidewalls and said bottom of said trench and in direct physical contact with said dielectric liner, said outer plate extending from said top surface of said substrate to under said trench;
   a doped silicon region in said substrate, said doped silicon region extending from said top surface of said substrate into said substrate a distance less than said trench extends into said substrate, said doped region physically and electrically contacting said plate, said doped silicon region doped a same type as said electrically conductive doped outer plate;
   a first electrically conductive metal silicide layer on a surface region of said doped silicon region proximate to said top surface of said substrate;
   a second electrically conductive metal silicide layer on a surface region of said inner plate proximate to said top surface of said substrate; and
   an insulating ring on said top surface of said substrate between said first and second metal silicide layers.

2. The design structure of claim 1, wherein said first electrically conductive metal silicide layer extends over a region of said outer plate exposed at said top surface of said substrate.

3. The design structure of claim 1, wherein said insulating ring extends over a continuous ring shaped portion of said top edge of dielectric liner.

4. The design structure of claim 1, wherein said insulating ring extends over all of said top edge of said dielectric liner.

5. The design structure of claim 1, wherein said insulating ring comprises only dielectric materials.

6. The design structure of claim 1, wherein said insulating ring comprises a gate stack comprising a gate polysilicon layer only on a top surface of a gate dielectric layer, a dielectric spacer on sidewalls of said gate stack, and a third electrically conductive metal silicide layer on a top surface of said gate polysilicon layer.

7. The design structure of claim 1, further including:
   a blanket dielectric layer on said substrate;
   a first electrically conductive contact extending from a top surface of said blanket dielectric layer to said first metal silicide layer and electrically contacting said first metal silicide layer; and
   a second electrically conductive contact extending from a top surface of said blanket dielectric layer to said second metal silicide layer and electrically contacting said second metal silicide layer.

8. The design structure of claim 1, wherein the design structure resides on a GDS storage medium.

9. The design structure of claim 1, wherein the design structure includes at least one of test data files, characterization data, verification data, or design specifications.

10. The design structure of claim 1, wherein when said substrate is an SOI substrate a depth of said trench into said substrate is selected to have said bottom surface of said substrate physically contact a buried oxide layer of said SOI substrate.

11. The design structure of claim 1, wherein when said substrate is an SOI substrate a depth of said trench into said substrate is selected to have said trench extend through a buried oxide layer of said SOI substrate.

* * * * *